United States Patent [19]

Beske et al.

[11] 4,355,055
[45] Oct. 19, 1982

[54] USE OF PROLONGED TACK TONERS FOR THE PREPARATION OF MULTILAYER ELECTRIC CIRCUITS

[75] Inventors: Grant A. Beske, Princeton Junction; Abraham B. Cohen, Springfield, both of N.J.; Roger O. Uhler, Wilmington, Del.

[73] Assignee: E. I. Du Pont de Nemours and Company, Wilmington, Del.

[21] Appl. No.: 288,401

[22] Filed: Jul. 30, 1981

Related U.S. Application Data

[62] Division of Ser. No. 124,607, Feb. 25, 1980, Pat. No. 4,303,698.

[51] Int. Cl.$^3$ ............................................. H05K 3/46
[52] U.S. Cl. .................................. 427/96; 427/126.1; 427/126.3; 427/126.4; 427/203; 427/376.2; 427/379; 427/380
[58] Field of Search ............... 430/109, 110, 126, 198, 430/291, 330; 427/96, 203, 379, 380, 126.1, 126.3, 126.4, 376.2

[56] References Cited

U.S. PATENT DOCUMENTS 3,060,024 10/1962 Burg et al. .
3,236,647 2/1966 Phlipot .
3,390,992 7/1968 Valles .................................. 430/291
3,637,385 1/1972 Hayes .................................. 430/198
4,109,377 8/1978 Blazick ................................ 427/96
4,215,193 7/1980 Manger ............................... 430/108
4,234,367 11/1980 Herron ................................ 427/96
4,285,780 8/1981 Schachter ........................... 427/96

OTHER PUBLICATIONS

Naguib et al., "A New Process for Printing Fine Conductor Lines and Spacings on Large Area Substrates", Nov. 1979, pp. 49–57.

*Primary Examiner*—John D. Smith

[57] ABSTRACT

Preparation of an electrically conductive pattern by adhering a prolonged tack toner which is activated by heating to the toner-receptive image areas of an inert substrate, the temperature is reduced and to the activated toner is applied a prolonged tack toner having conductive metal particles and glass frit as components; optionally the steps of heating, temperature reduction and toner application are repeated at least one time, and then the toned image is burned and fired. An electrically conductive pattern is obtained which is useful, for example, as an electric circuit. The process is also useful in the application of resistor and dielectric materials.

6 Claims, No Drawings

USE OF PROLONGED TACK TONERS FOR THE PREPARATION OF MULTILAYER ELECTRIC CIRCUITS

This is a division of application Ser. No. 124,607 filed Feb. 25, 1980, now U.S. Pat. No. 4,303,698.

DESCRIPTION

1. Technical Field

This invention relates to a process for preparing electric circuits. More particularly this invention relates to a process for preparing electrically conductive, resistive and dielectric patterns or combination of patterns using prolonged tack toners.

2. Background Art

Electric circuits can be comprised of electrically conductive patterns, resistor patterns and dielectric patterns or combinations thereof. The preparation of these patterns on inert substrates is known. By way of illustration, electrically conductive patterns on inert substrates can be prepared using compositions comprising carriers or vehicles, conductive metal particles and glass frit. The carrier or vehicle can be polymerizable or nonpolymerizable to actinic radiation. Generally these compositions are placed imagewise on the inert substrate by printing techniques such as screen printing. After firing the image of the pattern on the inert substrate a useful electrically conductive circuit is obtained. Screen printing has limited resolution capabilities. There exists a need to prepare electrically conductive patterns or electric circuits on inert substrates by an additive method which applies conductive materials only where desired to form a high resolution image of the desired pattern or circuit directly without need for development. A need also exists for the preparation of resistor and dielectric patterns by a similar method.

DISCLOSURE OF THE INVENTION

In accordance with this invention there is provided a process for the preparation of an electrically conductive pattern on an inert substrate comprising (a) applying a prolonged tack toner comprising an organic polymer and solid plasticizer to an image of the pattern on the inert substrate, said image having toner-receptive and background areas, (b) heating the image to a temperature sufficient to activate the toner by rendering the toner tacky, (c) reducing the temperature of the heated image below the activating temperature of the prolonged tack toner wherein the activated prolonged tack toner remains tacky, (d) applying prolonged tack toner comprising organic polymer, solid plasticizer, conductive particles and glass frit to the tackified toned image, (e) optionally repeating steps (b) through (d) at least one time, (f) burning off the organic polymer and plasticizer components of the prolonged tack toner by increasing the temperature of the inert substrate and toned image, and (g) firing the inert substrate and toned image to a temperature sufficient to fuse the glass frit and sinter the conductive particles.

The process for the preparation of electrically conductive patterns set forth above has many useful embodiments, all of which utilize toners which are referred to as "prolonged tack toners". These toners are non-tacky at normal room temperatures but upon heating to an elevated temperature become and remain tacky for a period of time even though the temperature of the toner returns or is returned to a temperature below the temperature at which the toner becomes tacky, including room temperature. Such toners are sometimes referred to as delayed tack toners. Suitable prolonged tack toners useful in the process of the invention comprise an organic polymer such as a thermoplastic resin, and a plasticizer or heat activatable tackifying agent solid at room temperature. Examples of prolonged tack toners include polystyrene and N-cyclohexyl-p-toluenesulfonamide, poly(methylmethacrylate(90)/methacrylic acid(10)) and triphenyl phosphate, styrene maleic anhydride copolymer and triethyleneglycol dibenzoate, etc. The plasticizer component is present in an amount greater than its compatibility level in the polymer or resin. In the case of the combination of poly(methylmethacrylate/methacrylic acid) and triphenyl phosphate plasticizer the plasticizer component is present in an amount greater than 48 percent by weight based on the weight of the polymer and plasticizer components.

The prolonged tack toners can be prepared by physical mixing of components, melt/suspension process, etc. Preferably a prolonged tack toner, as disclosed in Example 1 and comprising poly(methylmethacrylate(90)/methacrylic acid(10)) binder; triphenyl phosphate plasticizer, silver powder and glass frit, is prepared by a melt/suspension technique as follows: triphenyl phosphate is melted in a beaker and the poly(methylmethacrylate/methacrylic acid) is added with mixing until it dissolves. Silver powder and glass frit are stirred into the mixture to prepare a uniform suspension. The suspension is cooled by immersing in dry ice. After cooling, the hardened suspension is chipped out of the beaker and is ground to a particle size of about 50 to 250 microns using a standard size reduction machine such as an Osterizer ®. Care is taken at this stage not to generate heat sufficient to melt the toner. In practice, size reduction is accomplished by actuating the machine for short periods of time, e.g., 3 to 5 seconds and not more than 10 seconds. Following size reduction, the particles are wet ball milled for about 45 minutes in the presence of water using a vertical ball mill comprising a metal beaker, Dragonite glass beads and a stirring rod turning at about 200 rpm. The particles at this point are in the range of 5 to 10 microns average size. The milled toner is filtered and dried, preferably in a low humidity environment. Prior to use the toner is ground to break up any agglomerates present.

Novel prolonged tack toners which form electrically conductive patterns, comprise organic polymer and plasticizer components, conductive metal particles, glass frit, and optionally finely divided inorganic particles nonglass forming materials which are refractory. Preferred particulate metal particles are taken from the group consisting of silver, gold, platinum, copper, palladium and combinations thereof. The particle size range is about 0.3 to 10 microns (majority 1 to 5 microns) and the particles can be spherical, random or flake in shape. The metal particles are present in an amount of 86 to 98% by weight based on the weight of metal particles, glass frit and and inorganic particulate material.

The glass frit has a softening point range of 325°–600° C. Preferred glass frits include the lead boro-silicate-type glasses; an especially preferred composition is (mole %): $PbO(53.1)$, $B_2O_3(2.9)$, $SiO_2(29.0)$, $TiO_2(3.0)$, $ZrO_2(3.0)$, $ZnO(2.0)$, $Na_2O(3.0)$, and $CdO(4.0)$. The glasses can be prepared by conventional glass-making techniques, by mixing the desired components (or precursors thereof, e.g., $H_3BO_3$ for $B_2O_3$) in the desired proportions and heating the mixture to form a melt. Heating is conducted to a peak temperature and for a time such that the melt becomes entirely liquid, yet gaseous evolution has ceased. The peak temperature is in the range of 1100°–1500° C., usually 1200°–1400° C. The melt is then fritted by rapidly cooling the melt, e.g., by pouring onto a cold belt or into cold running water. Particle size reductions can be accomplished by milling. The glass frit is present in the toner in an amount of 3.75 to 10.30% by weight based on the combined weight of glass frit, metal particles and inorganic particulate materials.

Finely divided inorganic particulate nonglass forming materials which are refractory can optionally be present in the prolonged tack toner in amounts up to 45.0% by weight based on the weight of inorganic particulate refractory material, and glass frit, preferably about 25.0% by weight. Useful materials include: aluminum oxide, copper oxide, cadmium oxide, gadolinium oxide, zirconium oxide cobalt/iron/chromium oxide, etc. The oxides or their oxide precursors have a particle size range of 0.5 to 44.0 micrometers., with at least 80% by weight of the particles in the 0.1 to 5.0 micrometer range.

In addition to forming an electrically conductive pattern or circuit on a substrate, the process described above can be used to apply a resistor material to the substrate containing the conductive pattern. The patterns formed can be fired simultaneously or subsequent to the formation of each pattern on the substrate. Resistor compositions which can be mixed with the prolonged tack toners comprising organic polymer and plasticizer described above include:

(A) 20–75 parts by weight, based on the weight of (A) plus (B) plus (C), of a conductive pyrochlore having the general formula

$$(M_xBi_{2-x})(M'_yM''_{2-y})O_{7-z}$$

wherein
M is selected from the group consisting of yttrium, thallium, indium, cadmium, lead, copper and the rare earth metals;
M' is selected from the group consisting of platinum, titanium, chromium, rhodium and antimony;
M'' is ruthenium, iridium, or mixtures thereof;
x is 0–2 with the proviso that, for monovalent copper, $x \leq 1$;
y is 0–0.5 with the proviso that y is 0–1 when M' is either rhodium or more than one of platinum, titanium, chromium, rhodium and antimony; and
z is 0–1 with the proviso that it is at least equal to approximately x/2 when M is divalent lead or cadmium;

(B) 12–75 parts by weight, based on the weight of (A) plus (B) plus (C), of a glass binder having a coefficient of thermal expansion range of approximately $50-90 \times 100^{-7}/°$ C. and a coalescence temperature range of approximately 540°–950° C.;

(C) 2–30 parts by weight, based on the weight of (A) plus (B) plus (C), of a refractory finely divided filler having a low solution rate in the glass binder, a coefficient of thermal expansion range of approximately $40-60 \times 10^{-7}/°$ C. and a particle size range of 0.1–3 micrometers with at least 90% by weight in the 0.3–1 micrometer range.

The pyrochlore materials (A) are described in U.S. Patent No. 3,583,931, incorporated by reference. Preferred pyrochlores are bismuth ruthenate, $Bi_2Ru_2O_7$, and lead ruthenate, $Pb_2Ru_2O_6$. Other pyrochlores are $Pb_{1.5}Bi_{0.5}Ru_2O_{6.25}$ and $Gd BiRu_2O_{6.5}$. In these compounds y is zero.

A wide variety of glass binders (B) can be used, e.g., lead silicate, lead borosilicate, 23 to 34 weight % silica, mixed oxide glass, e.g., lithium oxide. Preferred ranges for the pyrochlore and glass binder components of the resistor composition are 23 to 70 parts by weight and 28 to 65 parts by weight, respectively, of the combined inorganic solids content of the compositions.

Examples of refractory finely divided filler (C) include: zircon, $ZrSiO_4$, having a thermal expansion of $46 \times 10^{-7}/°$ C. mullite, $Al_6Si_4O_{13}$, having a thermal expansion coefficient of $56 \times 10^{-7}/°$ C., etc. Optimum filler concentration for maximum compressive forces is 20 to 30 parts by weight. To avoid surface roughness of the fired elements, especially when large amounts of pyrochlore are present, 10 to 20 parts by weight of filler is preferred. Approximately 50% or less of refractory fillers having a coefficient of thermal expansion outside the range 40 to $60 \times 10^7/°$ C. can replace the above-described filler materials. Beta-spodumene, $LiAlSi_2O_6$ ($10 \times 10^{-7}/°$ C.) is an example of such a filler replacement.

In preparing multilayer conductive circuits, dielectric material can be applied between successive circuit strata with holes present in the dielectric layer to provide areas to connect the strata. Useful dielectric materials which can be mixed with the prolonged tack toners comprising organic polymer and plasticizer described above include: particles, e.g., 0.3 to 10 microns in size, of a glass composition which may be of the vitreous type or crystallizable type. Inorganic particles, e.g., titanium dioxide, barium titanate, alumina ($Al_2O_3$), etc. can be present in the mixture. It is understood that to be effective the thickness of the dielectric material should be sufficient to provide adequate insulation as known to one skilled in the art. With this invention, it is possible to build up the thickness of the dielectric material by many applications of prolonged tack toner containing the dielectric material. The applied dielectric is fired as is known to those skilled in the art.

In preparing an electrically conductive pattern or circuit, which may contain a resistor pattern, on an inert substrate, e.g., glass plate or sheet, float glass, ceramic, e.g., alumina (96%); procelain on steel, a toner-receptive image is generated on the substrate. Float glass is plate glass made by floating the glass while cooling on a bed of molten tin to provide a smooth surface adequate for the preparation of metallic conductive circuits. The toner-receptive image may be formed on the inert substrate directly, e.g., by applying a tacky material onto the inert substrate in an imagewise manner, or by applying a layer of tacky photosensitive composition to the inert substrate and imagewise exposing the layer whereby only the unexposed areas remain tacky and toner-receptive. The toner-receptive image may also be formed on the inert substrate by laminating as described in U.S. Pat. No. 4,174,216 a negative peel apart photosensitive element to the substrate, imagewise exposing the photosensitive element, stripping the cover sheet and toning the toner-receptive tacky areas.

Alternatively, a latent toner receptive image can be formed on a master substrate, e.g., polymeric film, plastic, metal or a sheet such as paper, whereon it adheres, and, after applying and activating prolonged tack toner, the toned image can be transferred to an inert substrate to form a tacky image on the substrate. "Latent toner receptive image on the substrate master", as used in this specification, means any image capable of being developed through the application of toner particles, including, but not limited to, electrostatic images, electromagnetic images, or those comprising tacky image areas and nontacky background areas. The tacky images can be formed directly, e.g., by exposure to actinic radiation, or by treatment with solutions, heat, or other means. Preferably the tacky images are formed in photosensitive layers which may be comprised of positive working or negative working compositions.

After the formation of the latent toner receptive image on the master substrate a prolonged tack toner is applied to produce a nontacky toned image. Generally, this toner contains organic polymer and plasticizer without the metal particles and glass frit. The toned image is heated to a temperature sufficient to activate the toner by rendering the toner tacky. The master substrate with its toned tacky image is then brought into intimate contact with an inert substrate, and while the toner is still activated, the master substrate and inert substrate are separated. A portion of the activated prolonged tack toner transfers imagewise from the master substrate to the inert substrate.

In order to form a duplicate image on another inert substrate, the temperature of the tackified toned master substrate is reduced (or permitted to be reduced) below the activating temperature of the prolonged tack toner wherein the toner remains tacky and prolonged tack toner is again applied over the remaining prolonged tack toner on the master substrate and the steps of heating the toner, contacting the toner with the new inert substrate and separating the surfaces are repeated. Each repetition of the process requires a new inert substrate. It is also possible to build up the toned image on the inert substrate by repeating the process as described above. A process for image development of a latent image on a master substrate and transferring the toned image to another substrate is described in U.S. application Ser. No. 124,605, filed Feb. 25, 1980 entitled "Multiple Transfer of Tacky Image Areas Using Prolonged Tack Toners".

After the image of the pattern is obtained on the inert substrate, prolonged tack toner is applied, the toned image areas are activated by heating, and the temperature is reduced below the activating temperature, wherein the activated prolonged tack toner remains tacky. A prolonged tack toner comprising organic polymer plasticizer, conductive metal particles and glass frit, resistor component and glass particles or dielectric materials as described above, is then applied to the tackified toned image. Additional amounts of the particulate metal containing toner can be applied to the conductive image as described. The final prolonged tack toner applied to the conductive image, in addition to the organic polymer and plasticizer, may contain solely metal particles, e.g., silver flake, or greater amounts of metal particles with the glass frit. It is also within the scope of the invention to apply as a final toner one which does not have prolonged tack properties.

In a similar manner resistor components and glass particles can be applied to a separate tackified toned pattern on the same substrate containing a conductive pattern. Dielectric materials can be applied in the form of a layer (with holes whereby electrical connections can be made) to insulate the conductive layers of a multilayer circuit.

The organic polymer, plasticizer and similar components of the prolonged tack toner are burned off by increasing the temperature of the inert substrate and toned image in the presence of oxygen. Subsequently, the inert substrate and toned image are fired to a temperature sufficient to fuse the glass frit and sinter the metal particles. The burning and firing temperatures used are dependent on the materials present in the toned image. When electrically conductive metal particles are present, a temperature range found useful for burning is 320° to 450° C., a firing temperature range is about 540° to 950° C., preferably 615° C. The coalescence temperature range for the resistor component and glass particles is 540° to 950° C., preferably 850° C. When electrically conductive and resistor patterns are present on the same substrate the burning and firing operations can occur simultaneously or individually for each image. The inert substrates, described above, are not affected by the elevated temperatures or the manner in which the pattern is generated thereon.

BEST MODE FOR CARRYING OUT THE INVENTION

The best mode is illustrated in Example 5.

INDUSTRIAL APPLICABILITY

The invention is useful for the preparation of electrically conductive patterns or circuits on inert substrates. It is also useful for making AC plasma display electrodes for computer video display output. Electrically conductive circuits can be prepared by the process using prolonged tack toners containing conductive metal particles and glass frit or other combination of metal particulate additives as described above. A combination of electrically conductive and resistor patterns can be made on the same substrate. Dielectric layers can be formed between electrically conductive circuits in the formation of multilayer circuits.

EXAMPLES

The following examples illustrate the invention wherein the parts and percentages are by weight. In the examples image means the same as pattern.

EXAMPLE 1

Preparation of Photohardenable Element

On a 0.007 inch (0.18 mm) polyethylene terephthalate film base coated with a resin sublayer, is coated a photohardenable layer having a thickness of 0.0004 inch (0.01 mm). The photohardenable layer is of the following composition:

| Component | Parts |
| --- | --- |
| Poly(methylmethacrylate) high molecular weight | 19.30 |
| Poly(vinyl acetate) high molecular weight | 19.30 |
| Trimethylolpropane trimethacrylate | 40.60 |
| Polyoxyethylated trimethylolpropane triacrylate | 9.10 |
| Polyethylene glycol [4] lauryl ether | 9.10 |
| 2-o-Chlorophenyl bisphenylimidazolyl dimer | 1.60 |
| 2,2'-Dihydroxy-4-methoxybenzophenone | 0.08 |
| 2-(Stilbyl-4'')-(naphtho-1',2',4,5)- | 0.20 |

| Component | Parts |
|---|---|
| 1,2,3-triazole-2"-sulfonic acid phenylester | |
| 2-Mercaptobenzochiazole | 0.80 |

Over this coated layer is laminated a cover sheet of 0.00075 inch (0.02 mm) polypropylene to form a photohardenable element.

Exposure of Photohardenable Element and Image Development by Toning

The photohardenable element is placed in a vacuum frame with the cover sheet facing the glass cover of the vacuum frame. A transparency with a positive line image of the subject to be reproduced is then placed over the cover sheet and the vacuum frame glass cover is closed. Vacuum of about 25 inches of water (~635 kg/meter$^2$) is applied, assuring intimate contact between the transparency and the element. Using a 2 K.W. standup Addalux ® light source equipped with a mercury bulb provided by the manufacturer as a "photopolymer bulb" for use with photohardenable materials, the element is exposed for about 40 seconds. The photohardenable surface exhibits latent tacky toner-receptive (unexposed) and nontacky background (exposed) image areas. The element is removed from the vacuum frame, and the cover sheet peeled off. The exposed element is toned by hand, using a pad to spread and work onto the tacky image areas prolonged tack toner particles of the following composition:

| Component | Amount (g) |
|---|---|
| Triphenyl phosphate (TPP) | 14.0 |
| Poly(methylmethacrylate(90)/methacrylic acid(10)) | 6.0 |

20 Cycles are used, each cycle corresponding to one complete coverage of the surface of the exposed element with the pad. At the end of the 20 cycles, toner is removed from the nontacky areas with a piece of treated cloth sold by the Las-Stik Manufacturing Co.

Preparation of Electrically Conductive Circuit

The toned element is subjected to heating to a temperature of about 60° C., whereby the toner particles melt and become tacky. The temperature is reduced to below 60° C. with the toner remaining tacky; the same prolonged tack toner described above is applied to the tacky areas. The retoned image is heated to 60° C. whereby the toners melt and become tacky. A float glass substrate preheated to 75° to 85° C. is brought into contact with the tacky toned surface of the element. Upon separation of the surfaces the tacky toned image transfers to the float glass substrate. The transferred image is toned eight times as described below with a silver-containing prolonged tack toner of the following composition:

| Component | Amount (g) |
|---|---|
| Silver powder, particle size distribution 0.3-10μ | 10.8 |
| Glass frit and inorganic refractory additives | 0.78 |
| Triphenyl phosphate | 6.3 |
| Poly(methylmethacrylate(90)/methacrylic acid(10)) | 2.1 |

The above-described prolonged tack toned image transferred to the glass substrate is heated to activate the toner. The toned image is then cooled to a temperature below the activation temperature, the toner remaining tacky. The tacky transferred image is toned with the silver-containing toner described above. The steps of heating, cooling, applying silver-containing toner is repeated seven more times until the density of silver on the transferred image is in the desired amount.

The toned image on the glass substrate is heated in air to 320° C., with holding at that temperature for one hour, followed by heating to 450° C. and holding in air at that temperature for one hour. The organic components present on the glass substrate are thus burned off. Subsequently the toned image on the glass substrate is subjected to firing at 615° C. for one hour thereby melting the glass frit in the toner and sintering the silver particles on the glass substrates. After cooling slowly in a glass annealing oven to prevent breakage, the resistivity measurements on the electrically conductive lines are measured as 0.034 ohm/square.

EXAMPLE 2

An imaged photohardenable element prepared as disclosed in Example 1 is toned twice as described in Example 1 with the following prolonged tack toner;

| Component | Amount (g) |
|---|---|
| Triphenyl phosphate | 15.0 |
| Poly(methylmethacrylate(90)/methacrylic acid(10)) | 5.0 |
| CI 109 red dye | 0.2 |

The red dye is included to allow easy viewing of the image, especially following activation of the toned image. After toning the image is transferred to float glass substrate at 75° to 85° C. using pressure rolls. The transferred image is toned six times with toner No. 1 described below followed by two more times with toner No. 2 described below using the same process of toning, heating to activate, cooling and retoning as described in Example 1. Toner No. 2 does not exhibit prolonged tack properties and yet it is possible to apply two layers of this toner because of the heavy buildup of prolonged tack toner during the preceding six tonings with toner No. 1. Toner No. 2 contains a high level of silver.

| Component | Toner No. 1 (g) | Toner No. 2 (g) |
|---|---|---|
| Silver having particle size 0.3-10μ | 9.38 | 16.8 |
| Glass frit | 0.38 | 0.7 |
| Inorganic refractory additives | 0.24 | 0.4 |
| Triphenyl phosphate | 6.62 | 1.4 |
| Poly(methylmethacrylate-(90)/methacrylic acid(10)) | 3.38 | 0.7 |

The toned sample is then heated, fired and cooled following the procedure described in Example 1. The measured resistivity is 0.112 to 0.130 ohm/square.

EXAMPLE 3

A prolonged tack toner of the following composition is applied over the latent toner-receptive image surface of a photohardenable element of the type described in Example 1:

| Component | Amount (g) |
|---|---|
| Silver powder (spherical particles 1–5μ) | 8.60 |
| Glass frit and Al₂O₃ | 1.38 |
| Triphenyl phosphate | 6.62 |
| Poly(methylmethacrylate(90)/-methacrylic acid(10)) | 3.38 |

The toned image is heated to 60° C. for thirty seconds, resulting in the melting of the toner. The melted toner is transferred onto the surface of a glass plate preheated to 85° C. as described in Example 1. The transferred image on the glass is retoned two times with the above-described toner using the procedure described in Example 1. The toned surface is then retoned once more using a nonprolonged tack toner containing silver having the following composition:

| Component | Amount (g) |
|---|---|
| Silver powder (spherical particles 1–5μ) | 15.3 |
| Glass frit and Al₂O₃ | 2.6 |
| Triphenyl phosphate | 1.4 |
| Poly(methylmethacrylate(90)/-methacrylic acid(10)) | 0.7 |

The toned image is heated in an oven at about 320° C. for one half hour and then is heated at 420° C. for another one half hour to burn off organic components present. After firing in an oven at about 615° C. to fuse the glass frit and sinter the silver powder, followed by cooling, the image on the plate glass surface is found to be electrically conductive with a resistivity of 0.14 ohm/square.

EXAMPLE 4

A tacky material is prepared by dissolving 1.2 grams of triethyleneglycol diacetate and 0.8 gram of polymethylmethacrylate (Elvacite ® 2008) in 18.0 grams of methylene chloride. Using the above solution, lines are painted on a clean, dry, cool glass substrate. Following the evaporation of the solvent, a tacky, clear image remains which is toned with toner No. 1 described below. Toner No. 1 present in the toned image is heated to its melting point, is allowed to cool to room temperature and is retoned. The toned image is subsequently heated, cooled, toned in accordance with the process disclosed in Example 1 for ten cycles, using toner No. 2 described below, followed by a final toning using toner No. 3 described below which increases the silver content:

| Component | Toner No. 1 (g) | Toner No. 2 (g) | Toner No. 3 (g) |
|---|---|---|---|
| Triphenyl phosphate | 15.0 | 7.10 | 1.4 |
| Poly(methylmethacrylate-(90)/methacrylic acid (10)) | 5.0 | 3.88 | 0.7 |
| Silver particles | — | 8.44 | 16.8 |
| Glass frit | — | 0.34 | 0.7 |
| Inorganic refractory additives | — | 0.24 | 0.4 |
| CI 109 red dye | 0.2 | — | — |

The multitoned image is heated at 325° C. for one hour, then at 450° C. for one hour and, finally, is fired at 615° C. for one hour. The resulting image has a resistivity of 0.084 ohm/square.

To the solution of tacky material as described above is added a slurry of polyethylene oxide in methanol in an amount to prepare a composition having 10% solids based on the weight of solids of the tacky material. The addition changes the viscosity from watery to highly viscous which when high shear is applied breaks down and flows readily. An image is prepared by screen printing the flowable sheared composition onto a glass plate. Using identical toners and the procedure described above in this example, an electrically conductive circuit is obtained.

EXAMPLE 5

A prolonged tack toner of the following composition is applied over the latent image surface of a photohardenable element of the type disclosed in Example 1:

| Component | Amount (g) |
|---|---|
| Flaked silver powder (particle size 0.3–10μ) | 8.44 |
| Glass frit | 0.34 |
| Inorganic refractory additives | 0.24 |
| Triphenyl phosphate | 8.24 |
| Poly(methylmethacrylate(90)/-methacrylic acid(10)) | 2.74 |

The developed image is transferred onto a glass plate following the procedure disclosed in Example 3. The transferred image is then retoned three times as described in Example 1 using a second toner having the following composition:

| Component | Amount (g) |
|---|---|
| Flaked silver powder (particle size 0.3–10μ) | 9.38 |
| Glass frit | 0.38 |
| Inorganic refractory additives | 0.24 |
| Triphenyl phosphate | 6.62 |
| Poly(methylmethacrylate(90)/-methacrylic acid(10)) | 3.38 |

The toned image is then retoned three additional times as described in Example 1 using a third toner having the following composition:

| Component | Amount (g) |
|---|---|
| Flaked silver powder (particle size 0.3–10μ) | 10.82 |
| Glass frit | 0.64 |
| Inorganic refractory additives | 0.14 |
| Triphenyl phosphate | 6.30 |
| Poly(methylmethacrylate(90)/-methacrylic acid(10)) | 2.10 |

The toned image is then further toned three more times as described in Example 1 using a final toner having the following composition:

| Component | Amount (g) |
| --- | --- |
| Flaked silver powder (particle size 0.3–10μ) | 16.8 |
| Glass frit | 0.7 |
| Inorganic refractory additives | 0.4 |
| Triphenyl phosphate | 1.4 |
| Poly(methylmethacrylate(90)/methacrylic acid(10)) | 0.7 |

Following burning and firing as disclosed in Example 1, the resistivity is measured as 0.034 ohm/square.

EXAMPLE 6

Example 3 is repeated except that in place of the final toner taught in Example 3 the final toning is accomplished with silver in flaked powder form having an average particle size between 0.3 and 10μ. The toned image is heated as described in Example 3 but is fired as described in Example 1, the resistivity measurements on the electrically conductive lines being measured as 0.03 ohm/square.

EXAMPLE 7

An imaged photohardenable element of the type disclosed in Example 1 is toned twice as described in that example using a toner having the following composition:

| Component | Amount (g) |
| --- | --- |
| Gold particles having a size less than 1μ | 4.83 |
| Glass frit | 0.17 |
| Triphenyl phosphate | 3.33 |
| Poly(methylmethacrylate(90)/methacrylic acid(10)) | 1.64 |

Following toning, the image is transferred onto a cleaned substrate comprising porcelain on a steel backing. The porcelain surface is cleaned by washing with acetone and is preheated under infrared radiation to a temperature of about 88° C. The transferred image is toned three times by the procedure described in Example 1 using the toner described above in this example and is then toned once using a second toner which does not exhibit prolonged tack properties having the following composition:

| Component | Amount (g) |
| --- | --- |
| Gold particles having a size less than 1μ | 9.04 |
| Glass frit | 0.32 |
| Triphenyl phosphate | 0.43 |
| Poly(methylmethacrylate(90)/methacrylic acid(10)) | 0.21 |

Following application of this second toner, the image is retoned using the first toner three times and the second toner one time. This procedure is again repeated to provide a total of twelve layers. The toned element is heated and fired as described in Example 1, and, after cooling, the resistivity is measured as 0.001 to 0.002 ohm/square.

EXAMPLE 8

A flat ceramic substrate comprising porous alumina is cleaned and prepared by dipping in a 1% solution of poly(methylmethacrylate(90)/methacrylic acid(10)) in acetone. An image is formed on a photohardenable element of the type disclosed in Example 1, using two layers of the following toner:

| Component | Amount (g) |
| --- | --- |
| Triphenyl phosphate | 15.0 |
| Poly(methylmethacrylate (90)/methacrylate acid(10)) | 5.0 |
| CI 109 red dye | 0.2 |

Using the procedure described in Example 7, the image is transferred to the ceramic substrate and toned one more time using the above-described toner. Then using the procedure described in Example 7 whereby toning occurs using the first toner No. 1 three times followed by the second toner No. 2 once, a total of four separate cycles is employed to obtain a total of fifteen layers. The following toners are used as toner No. 1 and toner No. 2:

| Component | Toner No. 1 (g) | Toner No. 2 (g) |
| --- | --- | --- |
| Copper powder | 9.0 | 14.1 |
| Glass frit | 1.0 | 0.9 |
| Triphenyl phosphate | 6.62 | 3.74 |
| Poly(methylmethacrylate-(90)/methacrylic acid(10)) | 3.38 | 1.26 |

The sample is subsequently fired in a nitrogen belt type furnace set to reach a peak temperature of 900° C. The total firing time is one hour. Following firing and subsequent cooling, the resistivity is measured as 0.004 to 0.008 ohm/square.

We claim:

1. A process for the preparation of a multilayer conductive circuit which comprises connected electrically conductive patterns on at least two inert substrates with a dielectric layer between each pair of substrates, the improvement comprising (a) applying over each conductive substrate in the form of a layer with connector hole openings a particulate prolonged tack toner comprising organic polymer, solid plasticizer and particles of glass dielectric material, and optionally containing inorganic particles, (b) heating the layer containing prolonged tack toner to a temperature sufficient to activate the toner by rendering the toner tacky, (c) reducing the temperature of the layer below the activating temperature of the prolonged tack toner wherein the activated prolonged tack toner remains tacky, (d) repeating steps (a) to (c) at least one time, and (e) firing the dielectric layer to a temperature sufficient to form a smooth layer.

2. A process according to claim 1 wherein the glass dielectric is of the vitreous type.

3. A process according to claim 1 wherein the glass dielectric is of the crystallizable type.

4. A process according to claim 1 wherein titanium dioxide inorganic particles are present.

5. A process according to claim 1 wherein barium titanate inorganic particles are present.

6. A process according to claim 1 wherein alumina inorganic particles are present.

* * * * *